United States Patent
Polak et al.

(10) Patent No.: US 10,823,806 B2
(45) Date of Patent: Nov. 3, 2020

(54) MAGNETIC RESONANCE IMAGING USING DATASET UNDERSAMPLING

(71) Applicant: Siemens Healthcare GmbH, Erlangen (DE)

(72) Inventors: Daniel Polak, Blackenbach (DE); Yen Mei Lisa Chuah, Nuremberg (DE); Esther Raithel, Dormitz (DE)

(73) Assignee: Siemens Healthcare GmbH, Erlangen (DE)

( * ) Notice: Subject to any disclaimer, the term of this patent is extended or adjusted under 35 U.S.C. 154(b) by 172 days.

(21) Appl. No.: 15/820,681

(22) Filed: Nov. 22, 2017

(65) Prior Publication Data

US 2019/0154784 A1    May 23, 2019

(51) Int. Cl.
| | |
|---|---|
| *G01R 33/561* | (2006.01) |
| *G01R 33/58* | (2006.01) |
| *G01R 33/56* | (2006.01) |
| *G01R 33/48* | (2006.01) |
| *G01R 33/565* | (2006.01) |

(52) U.S. Cl.
CPC ..... *G01R 33/5617* (2013.01); *G01R 33/4818* (2013.01); *G01R 33/5608* (2013.01); *G01R 33/5611* (2013.01); *G01R 33/583* (2013.01); *G01R 33/4822* (2013.01); *G01R 33/56509* (2013.01); *G01R 33/56545* (2013.01)

(58) Field of Classification Search
USPC ................................................ 324/300–322
See application file for complete search history.

(56) References Cited

U.S. PATENT DOCUMENTS

| | | | |
|---|---|---|---|
| 4,853,635 A | 8/1989 | Cuppen | |
| 2008/0310696 A1* | 12/2008 | Hwang | G01R 33/56341 382/131 |
| 2015/0160319 A1* | 6/2015 | Choi | G01R 33/5611 324/309 |

(Continued)

OTHER PUBLICATIONS

Bilgic et al., "Simultaneous Time Interleaved MultiSlice (STIMS) for Rapid Susceptibility Weighed Acqusition," NeuroImage, vol. 155, pp. 577-586 (2017).

(Continued)

*Primary Examiner* — Jay Patidar
(74) *Attorney, Agent, or Firm* — Schiff Hardin LLP (57) ABSTRACT

Magnetic resonance (MR) data are acquired by applying magnetic fields to an examination region concurrent with stimulated echo signals, such that trajectories, which are not straight lines, are generated in k-space. For this purpose, sequence of RF pulses is applied to generate the stimulated echo signals in the examination object, undersampled MR measurement data are detected during reception of the stimulated echo signals in the at least two receiving coils, along the curved k-space trajectories, and fully sampled MR measurement are generated from the undersampled MR measurement data using sensitivity information of the at least two receiving coils. Alternatively, the MR measurement data are fully sampled in a central region of k-space, and a region outside the central region is not fully sampled, and a phase correction with a Partial Fourier technique is executed on the MR measurement data using fully sampled MR measurement data from the central region of k-space.

16 Claims, 4 Drawing Sheets

(56) References Cited

U.S. PATENT DOCUMENTS

2016/0274209 A1* 9/2016 Dannels ............ G01R 33/4824
2018/0164395 A1 6/2018 Setsompop et al.

OTHER PUBLICATIONS

Bilgic, et al.: "Wave-CAIPI for Highly Accelerated 3D Imaging"; Magnetic Resonance in Medicine; pp. 1-11;(2014).
Polak, et al.: "Wave-CAIPI for Highly Accelerated MP-RAGE Imaging"; Magnetic Resonance in Medicine; pp. 1-6; (2017).
Lustig, et al.: "Sparse MRI: The Application of Compressed Sensing for Rapid MR Imaging" Magnetic Resonance in Medicine; vol. 58, No. 6; pp. 1182-1195; (2007).
Breuer, et al.: "Controlled Aliasing in Volumetric Parallel Imaging (2D CAIPIRINHA)"; Magnetic Resonance in Medicine; vol. 55; pp. 549-556; (2006).
Cauley, et al.: "Autocalibrated Wave-CAIPI Reconstruction; Joint Optimization of k-Space Trajectory and Parallel Imaging Reconstruction"; in: Magnetic Resonance in Medicine; pp. 1-7; (2016).
Fritz, et al.: "Six-Fold Acceleration of High-Spatial Resolution 3D SPACE MRI of the Knee Through Incoherent k-Space Undersampling and Iterative Reconstruction—First Experience"; Investigative Radiology; vol. 51, No. 6; pp. 400-409; (2016).
Griswold, et al.: "Generalized Autocalibrating Partially Parallel Acquisitions (GRAPPA)"; Magnetic Resonance in Medicine; vol. 47; pp. 1202-1210; (2002).
Gagoski, et al.: "RARE/Turbo Spin Echo Imaging with Simultaneous Multislice Wave-CAIPI"; Magnetic Resonance in Medicine; vol. 73; pp. 929-938; (2015).
Mugler III, et al, "Optimized Single-Slab Three-Dimensaional Spin_echo MR Imaging of the Brain," Radiology, vol. 216, pp. 891-899 (2000).
Mugler III, "Optimized Three-Dimensional Fast-Spin-Echo MRI," Journal of Magnetic Resonance Imaging, vol. 39 pp. 745-767 (2014).

* cited by examiner

FIG 1

Prior Art

MAGNETIC RESONANCE IMAGING USING DATASET UNDERSAMPLING

BACKGROUND OF THE INVENTION

Field of the Invention

The present invention relates to magnetic resonance (MR) imaging and in particular to a MR imaging method using k-space trajectories, which are not constant lines. The invention also encompasses a corresponding MR apparatus and an electronically readable data carrier that implement such a method.

Description of the Prior Art

The MR measurement sequence SPACE combines TSE-type contrast (Turbo Spin Echo Sequence, in short TSE) with a possibility for isotropic measurement resolution, i.e. uniform voxels in all directions, paired with a high signal to noise ratio (SNR) by volumetric excitation. However, SPACE has a number of disadvantages that limit its acceptance in clinical routine. In particular, high measurement times are required due to a large number of phase and partition encoding steps required for high spatial resolution in 3 dimensions, such as 1 mm isotropic resolution. For example, a conventional SPACE FLAIR protocol performed for a picture matrix 256×256×192 with 1 mm isotropic resolution of the head of a patient takes about 6 minutes. Such a long scanning time is limiting patient throughput and increases the risk of motion artifacts. Furthermore, breath-hold applications such as for SPACE for MRCP are strongly affected. For further information regarding the SPACE sequence, and in particular for the application of variable RF (radio-frequency) flip angles and the generation of spin echoes and stimulated echoes in SPACE, reference is made to the document "Optimized Single-Slab Three-Dimensional Spin-Echo MR Imaging of the Brain" by John P. Mugler et al. in Radiology 2000; 216:891-899, and the document "Optimized Three-Dimensional Fast-Spin-Echo MRI" by John P. Mugler in Journal Of Magnetic Resonance Imaging 39:745-767, 2014.

The measurement time of a 3D SPACE sequence can be reduced using several conventional methods, wherein both a single method and a combination of several methods can be used.

According to a first conventional method, the turbo factor is increased, wherein a MR measurement sequence with an in-creased large number of phase and partition encoding steps is executed within a single echo train. For most techniques used in clinical MRI, the primary role of an RF pulse is either excitation or refocusing. However, optimized single-slab 3D-FSE imaging often uses refocusing RF pulses with variable flip angles, and for these pulses another echo formation mechanism—the "stimulated" echo (84)—makes a major contribution to signal amplitudes during the echo train. Three RF pulses are required to generate a stimulated echo, as com-pared to two RF pulses to generate a spin echo. In particular, a plurality of 90° RF pulses is applied to flip magnetization from and to the x/y plane of the MR measurement, i.e. the traversal plane, and the plane including the z-axis, as described in further detail in the document "Optimized Three-Dimensional Fast-Spin-Echo MRI" by John P. Mugler in Journal Of Magnetic Resonance Imaging 39:745-767, 2014. With regard to the longer duration of the echo train, such an optimized flip angle sequence is required to reduce relaxation effects and generate 2D TSE-like contrast.

Accordingly, by increasing the turbo factor, the number of recorded k-space lines per TR is increased, and thus a shorter scanning time is provided. However, despite flip angle optimization, the magnetization cannot be kept fully constant over time, which leads to blur-ring effects along the phase and partition directions. These blurring effects increase with longer duration of the echo train.

According to a second conventional method, a Partial Fourier technique is used, which allows time reduction by asymmetric scanning of the k-space along the phase and/or partition direction. Common Partial Fourier factors are 5/8 or 9/16, but they can also be individually adapted to a specific MR measurement situation, which is often used by SPACE to achieve desired effective echo times. Conventionally, phase errors are corrected for example by a Margosian filter, as described by Margosian, 1984, or a POCS algorithm, as described by Cup-pen and Van Est, 1987. Therefore, in common SPACE sequences Partial Fourier techniques are used to shorten measurement time and achieve a desired effective TE. The combination of Partial Fourier and Wave-CAIPIRINHA is, however, not feasible according to conventional MR imaging methods.

According to a third conventional method, multichannel coils in combination with parallel imaging methods are used, which allow a reduction of the number of phase and partition encoding steps, thus leading to a reduction in MR measuring time, if the echo train is arranged appropriately in k-space.

In particular, according the GRAPPA technique, as described in the document "Generalized autocalibrating partially parallel acquisitions (GRAPPA)" by Griswold et al. in Magn Reson Med. 2002 June; 47(6):1202-10, after measuring of autocalibration lines (ACS), which are usually acquired in the k-space center, GRAPPA weights are fitted to the measured ACS lines. From these ACS lines, previously not measured k-space lines can subsequently be reconstructed and the complete MR image can be recovered without losses in image resolution.

Further, according to the CAIPIRINHA technique, as described in the document "Controlled aliasing in volumetric parallel imaging (2D CAIPIRINHA)" by Breuer et al. in Magn Reson Med. 2006 March; 55(3):549-56, k-space lines are arranged for example in a chessboard-like pattern in k-space according to a selected CAIPIRINHA offset, wherein a real chessboard is an option for a 2×2 acceleration, but other patterns are possible. Reconstruction is carried out either in k-space or image space using information about the coil sensitivities.

Furthermore, conventional compressed sensing methods can be applied, as described in the document "Sparse MRI: The application of compressed sensing for rapid MR imaging" by Lustig et al. in Magn Reson Med. 2007 December; 58(6):1182-95. Sparsity for MR images can be assumed if a suitable transformation do-main (e.g. wavelet domain) is chosen. This prior-knowledge allows the reconstruction of strongly undersampled MR data using time-consuming reconstruction methods, which depend on efficient parameter selection. However, the degree of sparsity for static SPACE images is much lower than for dynamic applications. For example, a maximum of 6-fold undersampling for a CS SPACE measurement sequence at the knee of patient has been demonstrated, as described in the document "Six-Fold Acceleration of High-Spatial Resolution 3D SPACE MRI of the Knee Through Incoherent k-Space Undersampling and Iterative Reconstruction—First Experience" by Fritz et al. in Investigative Radiology, 2016 June; 51(6): 400-9.

Therein, the g-factor is a measure for the quality of a parallel imaging approach and indicates which fraction of the SNR is lost due to encoding. This restricts GRAPPA and CAIPIRINHA methods, in contrast to the WAVE-CAIPIRINHA method, to acceleration factors of approximately R=2 to 4, whereas otherwise noise artefacts will become predominant.

SUMMARY OF THE INVENTION

Accordingly, there is a need for improved MR imaging methods, which overcome the above-mentioned disadvantages. It is, therefore, an objective of the present application to provide such an improved MR imaging method, which is more efficient and allows faster MR scanning times compared to conventional MR imaging methods.

According to a first embodiment of the invention, in a method for generating an MR image of an examination object in a MR apparatus having at least two receiving coils, a sequence of RF pulses is applied to the examination object in order to generate stimulated echo signals in the examination object. Gradient magnetic fields also are applied to the examination region concurrent with the stimulated echo signals, such that trajectories, which are not constant lines, are generated in k-space. The k-space trajectories can be arbitrary curved trajectories, for example spiral-shaped trajectories. Arbitrary gradient shapes can be used as long as the same gradient shape is used for every ky/kz line of k-space. The k-space trajectories may have a periodic characteristic. Undersampled MR measurement data (i.e., data that are entered into k-space with a density that does not satisfy the Nyquist criterion) are detected during reception of the stimulated echo signals by the at least two receiving coils. Fully sampled MR measurement data are generated in a computer from the undersampled MR measurement data using sensitivity information of the at least two receiving coils, from which the MR image of the examination object is subsequently reconstructed, and the MR image is made available in electronic form from the computer, as a data file. The stimulated echo signals according to the method can be spin echo signals and stimulated echo signals, wherein the spin echo signals are not stimulated echo signals.

With the improved MR imaging method according to the invention, MR measurement time can be shortened considerably without resolution losses and with negligible noise amplification, i.e. low g-factor. In consequence, time-consuming MR sequences, such as SPACE, become available in similar measurement times as in conventional 2D TSE measurement methods, wherein SPACE additionally offers the advantage that Multiplanar Reconstructions (MPRs) can be reconstructed in any orientation using an isotropic MR measurement resolution. The method according to the invention is of particular interest for low-end apparatuses, such as low field apparatuses or low channel count apparatuses, since low-field apparatuses have lower intrinsic SNR than high-field apparatuses, and accordingly g-factor noise becomes more influential. Therefore, the method according to the invention advantageously enables a better performance with a lower number of coils than conventional parallel imaging methods, which results in better MR image quality and shorter MR measurement times compared to conventional MR imaging methods. In particular, patient throughput can be increased and the risk of motion artifacts is reduced.

For reducing FID artifacts in slab-selective SPACE, such as for example MR imaging of the hip of a patient, more than one average is often recorded, which is particularly improved as intrinsic SNR loss is prevented by subsampling. In addition, it is possible to use the additional SNR for higher resolution purposes.

According to a further embodiment of the invention, in a method for generating an MR image of an examination object in a MR apparatus, MR measurement data are acquired that fully sample (i.e., filled so as to satisfy the Nyquist criterion) a central region of k-space, and the region of k-space outside this central region is not fully sampled, wherein gradient magnetic fields concurrent with spin echo signals from the examination object are applied, such that trajectories, which are not constant lines, are generated in k-space. The k-space trajectories can be arbitrary curved trajectories, for example spiral-shaped trajectories, wherein arbitrary gradient shapes can be used as long as the same gradient shape is used for every ky/kz line of k-space. The gradient shapes may have a periodic characteristic. A phase correction with a Partial Fourier technique is executed in a computer on the MR measurement data using fully sampled MR measurement data from the central region of k-space. The phase corrected MR measurement data generated by executing the phase correction on the MR measurement data are used for reconstructing the MR image of the examination object, and the MR image is made available in electronic form from the computer, as a data file.

The improved MR imaging method according to this further embodiment of the invention achieves advantages similar to those described for the first embodiment of the invention, in particular MR image quality can be further improved and MR measurement times can be shortened significantly compared to conventional MR measurement methods by using a conventional Partial Fourier method in combination with a wave-CAIPIRINHA method.

The invention also encompasses a MR apparatus designed for improved MR imaging by implementing either of the embodiments of the method of the invention, wherein the MR apparatus has a computer with a memory and at least one processor, the memory containing instructions to be executed by the at least one processor, wherein execution of the instructions by the at least one processor causes the MR apparatus to execute the steps of the method according to any one or any combination of the embodiments described above. The MR apparatus can be a MR data acquisition apparatus, a MR imaging apparatus, or a medical MR imaging apparatus.

The present invention also encompasses a non-transitory, computer-readable data storage medium encoded with programming instructions that, when the storage medium is loaded into a control computer of a magnetic resonance apparatus, cause the control computer to operate the magnetic resonance apparatus in order to executed any or all embodiments of the method according to the invention, as described above.

For such an MR apparatus and electronically readable data carrier, technical effects can be achieved that correspond to the technical effects described for the improved MR imaging method according to the first and second embodiments of the invention.

Although specific features described in the above summary and the following detailed description are described in connection with specific embodiments and aspects of the present invention, it should be understood that the features of the exemplary embodiments and aspects may be combined with each other, and correlate to each other, unless specifically noted otherwise.

Therefore, the above summary is merely intended to give a short overview over some features of some embodiments and implementations and is not to be construed as limiting. Other embodiments may comprise other features than those explained above.

DESCRIPTION OF THE PREFERRED EMBODIMENTS

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, modules or other physical or functional units shown in the drawings or described herein may also be implemented by an direct or indirect, connection or coupling. A coupling between components may be established wired or over a wireless connection. Functional blocks, computing devices, nodes or entities may be implemented in hardware, firmware, software, or a combination thereof.

In the following, techniques related to the improved methods for generating an MR image of an examination object in a MR apparatus according to the invention will be described in further detail.

Figure 1:
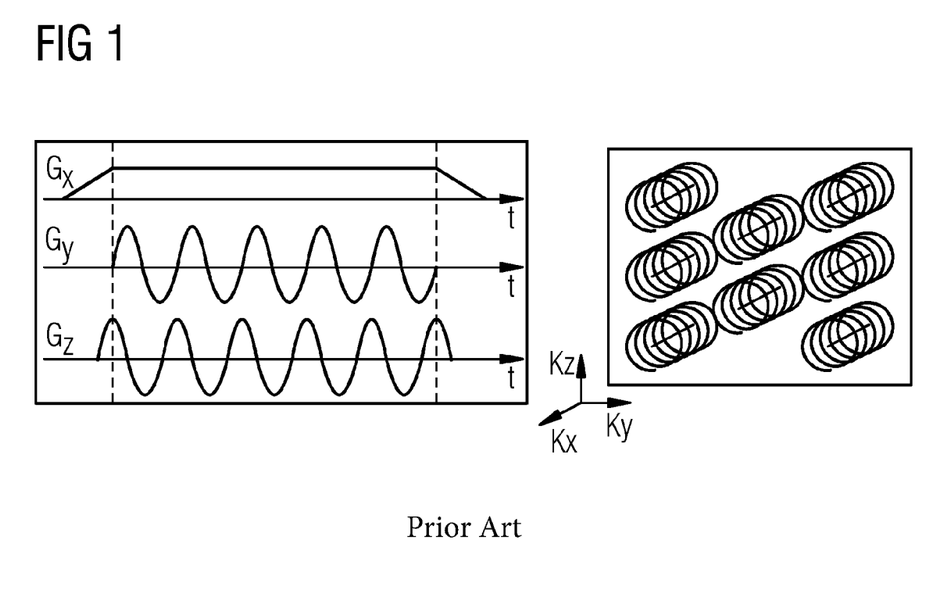
FIG. 1 illustrates a schematic diagram of a conventional wave-CAIPI method.

FIG. 1 is a schematic diagram of a conventional wave-CAIPIRINHA sequence of an MR apparatus 1.

As can be seen from FIG. 1, in a conventional wave-CAIPIRINHA, or wave-CAIPI sequence, oscillating, or in other words undulating, wave gradient magnetic fields are played out on the $G_y$ and $G_z$ axes during readout of spin echo and stimulated echo signals, wherein in readout direction on the $G_x$ axis a constant gradient magnetic field is applied. This results in spiral-shaped trajectories in k-space, also referred to as "corkscrew" trajectories, as described in detail in the document "Wave-CAIPI for highly accelerated 3D imaging" by Bilgic et al. in Magn Reson Med. 2015 June; 5 73(6): 2152-62.

Figure 2:
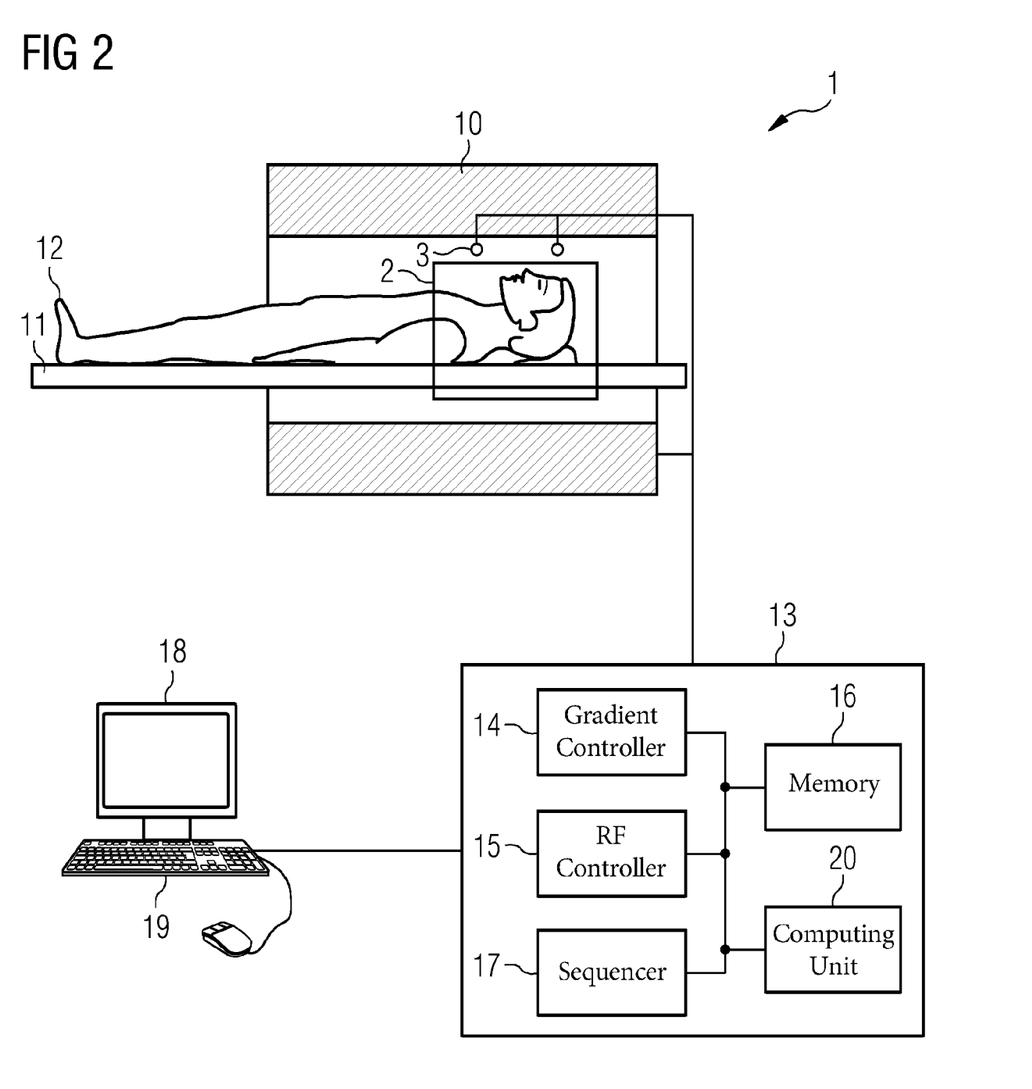
FIG. 2 schematically illustrates an MR apparatus having at least two receiving coils, according to embodiments of the invention.

FIG. 2 is a schematic illustration of a MR apparatus 1 comprising at least two receiving coils 3, according to embodiments of the invention.

Referring to FIG. 2, an MR apparatus 1 is described, with which, as explained below, the improved methods for generating an MR image of an examination object 12 can be performed. The examination person 12, or more generally examination object 12, is located in an examination tunnel within an examination region 2 of an MR data acquisition scanner 10 of the MR apparatus 1. The scanner 10 has a magnet that generates a basic field B0. The examination object 12 is positioned on an examination table 11, which may be used to move the examination object 12 in the center of the scanner 10 into the examination region 2, such that the MR apparatus 1 receives spatially coded magnetic resonance signals from the examination region 2 acquired by multiple receiving coils 3. By radiation of RF pulse sequences and switching of the gradient magnetic fields 7, certain nuclear spins in the examination region 2 are deflected from the equilibrium position and spin echo and stimulated echo signals are generated in the examination object 12. Currents induced by the spin echo and stimulated echo signals 6, as the spins return to the equilibrium position imposed by the basic field B0, are converted into magnetic resonance signals in the receiving coils 3, so as to be detected as generating MR measurement data. The MR measurement signals detected by each receiving coil 3 are associated with a corresponding MR measurement channel. The general modes of operation for the generation of MR images and the detection of the magnetic resonance signals are known to those skilled in the art, so that a more detailed explanation thereof is not necessary herein.

The MR apparatus 1 has a MR controller 13, which controls the MR apparatus 1. The central MR controller 13, which is configured to perform the improved MR method according to the invention, further has a gradient controller 14 for controlling and switching the gradient magnetic fields, and an RF controller 15 for controlling and radiating the RF pulses for deflecting the nuclear spins from the equilibrium position. In a memory 16, the imaging sequences necessary for recording the MR images can be stored, as well as the programs that are necessary for the operation of the MR apparatus 1. A sequencer 17 controls the image recording and thus controls the sequence of the gradient magnetic fields and RF pulses and the reception intervals of MR measurement signals as a function of the determined imaging sequences. The sequencer 17 also controls the gradient controller 14 and the RF controller 15. MR images, which can be displayed on a display 18 can be calculated in a computing unit 20, whereby an operator operates the MR apparatus via an input unit 19. The memory 16 can have imaging sequences and program modules, which carry out the method according to the invention when executed in the computing unit 20 of one of the modules. The RF controller 15 may further be configured to improve the method for MR imaging, as is explained in the following in detail. In particular, memory 16 stores control information, which can be derived from the MR controller 13. Further, the sequencer 17 is adapted to perform the following MR measurement method.

The MR apparatus of FIG. 1 is designed such that, during the execution of the control information in the MR controller 13, a MR measurement method according to embodiments of the invention is performed.

Figure 3:
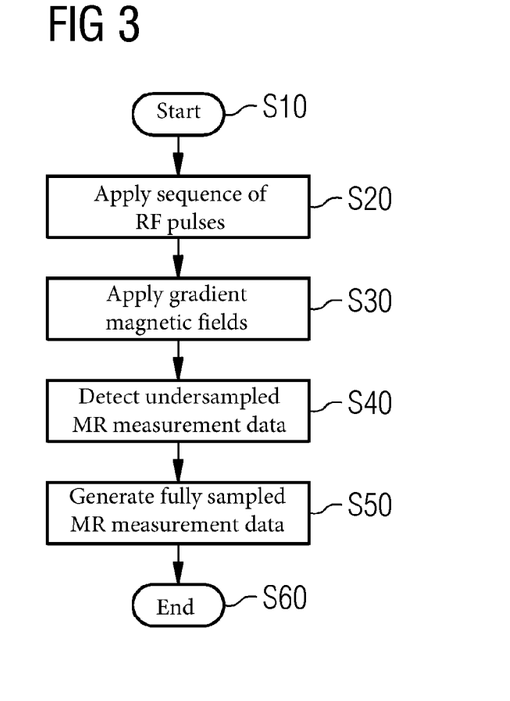
FIG. 3 is a flowchart with steps for performing a method for generating an MR image of an examination object in a MR apparatus comprising at least two receiving coils, according to embodiments of the invention.

FIG. 3 is a flowchart with steps for performing a method for generating an MR image of an ex-amination object 12 in a MR apparatus 1 comprising at least two
10 receiving coils 3, according to embodiments of the invention.

The method starts in step S10. In step S20, a sequence of RF pulses is applied to the examination object 12 to generate stimulated echo signals in the examination object 12. In step S30, gradient magnetic fields are applied to the examination region 2 concurrent with the stimulated echo signals 6, such that trajectories, which are not constant lines, are generated in k-space. In step S40, undersampled MR measurement data is detected during receiving of said stimulated echo signals in the at least two receiving coils 3. In step S50, fully sampled MR measurement data is generated from the undersampled MR measurement data using sensitivity in-formation of the at least two receiving coils 3 for generating the MR image of the examination object 12. The method ends in step S60.

Figure 4:
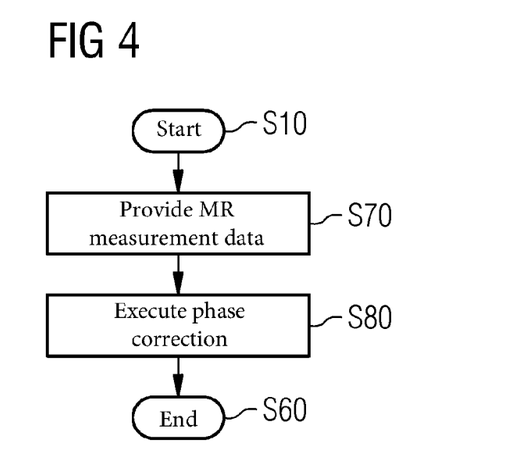
FIG. 4 is a flowchart with steps for performing a further method for generating an MR image of an examination object in a MR apparatus, according to embodiments of the invention.

FIG. 4 is a flowchart with steps for performing a further method for generating an MR image of an examination object 12 in a MR apparatus 1, according to embodiments of the invention.

The method starts in step S10. In step S70, MR measurement data is provided, which is fully sampled in a central region of k-space, wherein the region outside the central region is not fully sampled, wherein gradient magnetic fields concurrent with spin echo signals from the examination object 12 are applied, such that trajectories, which are not constant lines, are generated in k-space. The spin echo signals according to step S70 can comprise stimulated echo signals in one embodiment. In step S80, a phase correction with a Partial Fourier technique is executed on the MR measurement data using fully sampled MR measurement data from the central region of k-space. The phase corrected MR measurement data, which is generated by executing the phase correction on the MR measurement data, can consequently be used for generating the MR image of the examination object 12. The method ends in step S60.

Figure 5:
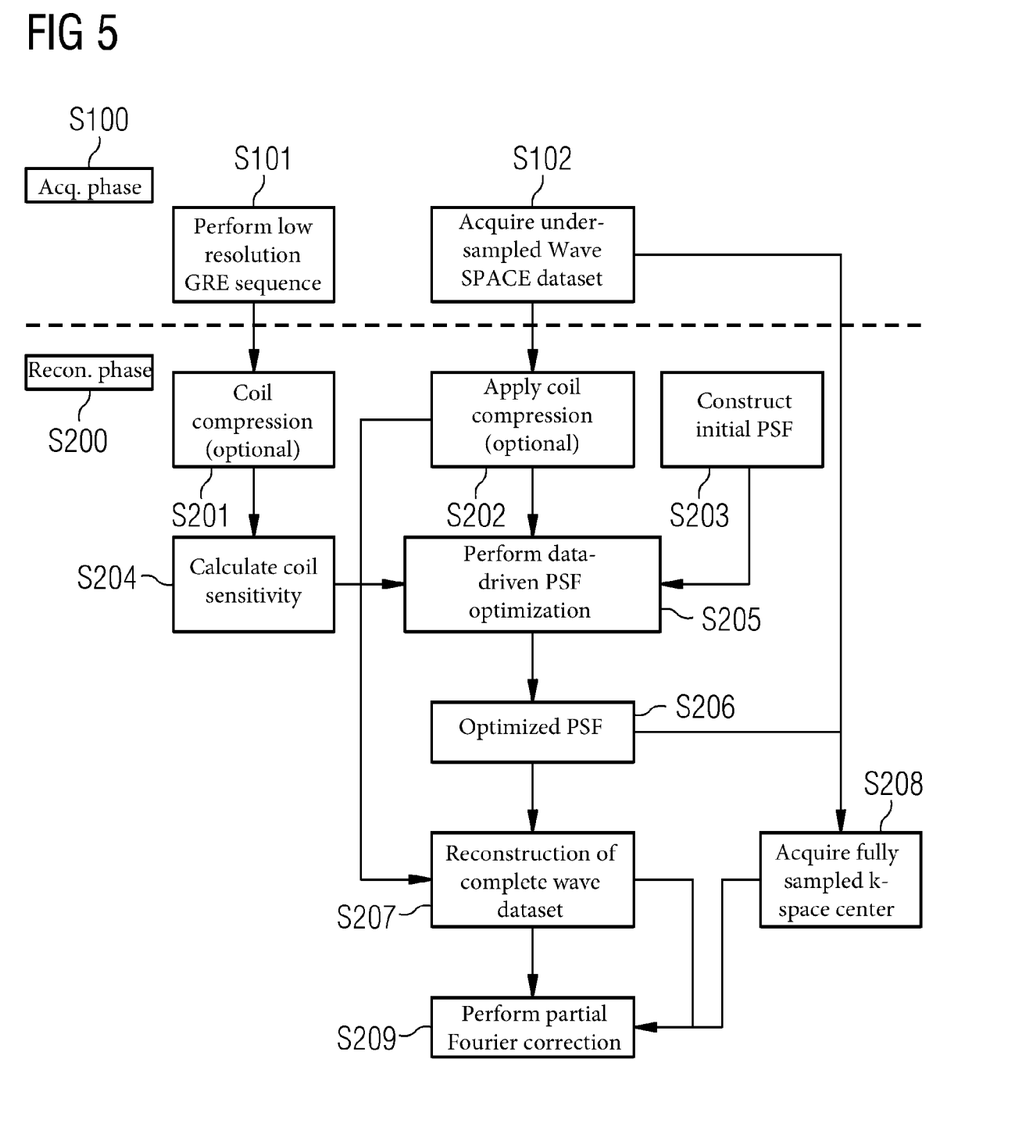
FIG. 5 is a flowchart with steps for performing further method for generating an MR image of an examination object in a MR apparatus, according to embodiments of the invention.

FIG. 5 schematically illustrates a further method for generating an MR image of an examination object in a MR apparatus, according to embodiments of the invention.

As can be seen from FIG. 5, MR measurement data are acquired in a first phase S100 of the method, wherein the construction methods are performed in reconstruction phase S200. Therein, in step S101 of acquisition phase S100, a low resolution Gradient Echo (GRE) sequence is performed, which is used for an optional coil compression in step S201 of reconstruction phase S200, using for example a singular value de-composition (SVD) technique. Thereafter, in step S204, a coil sensitivity calculation, such as ESPIRiT is executed on the data.

Further, in step S102 of the data acquisition phase S100, an undersampled Wave SPACE dataset is acquired. The under-sampled Wave SPACE dataset includes in one embodiment a fully sampled k-space center, which is required in the case that a Partial Fourier technique is used in acquisition. In step S202 of reconstruction phase S200, a coil compression technique is applied optionally to the undersampled Wave SPACE dataset, for example using a singular value decomposition (SVD) technique.

In step S205, a data-driven PSF optimization is performed. In particular, the data-driven PSF optimization may use representative test points, and may further be based on data input from the coil sensitivity calculation in step S204, data input from the coil sensitivity calculation in step S202, and an initial PSF, which is theoretically constructed in step S203. The outcome of the data-driven PSF optimization in step S205 is the optimized PSF as shown in step S206.

The optimized PSF of step S206 and the undersampled Wave SPACE dataset after the optional coil compression of step S202 are both used for a reconstruction of a complete wave dataset in step S207. Therein, ideally an iterative k-space based reconstruction is executed where Partial Fourier is used to make use of the fully sampled k-space center. An ex-ample of an iterative wave reconstruction, which is particularly advantageous for combination with a Partial Fourier technique is described in the document "Simultaneous Time Interleaved MultiSlice (STIMS) for Rapid Susceptibility Weighted Acquisition" by Bilgic, Ye, Wald and Setsompop, NeuroImage, http://dx.doi.org/10.1016/j.neuroimage.2017.04.036. Therein, in contrast to the original wave-CAIPI disclosure "Wave-CAIPI for Highly Accelerated 3D imaging" by Bilgic et al. in Magn Reson Med. 2015 June; 73(6):2152-62, a k-space based reconstruction is used, wherein the fully sampled k-space center is used in reconstruction and, therefore, enables a better signal-to-noise ratio (SNR). In particular, the regulation terms $\lambda_g$ and $\lambda_w$ in the equation $$\min_p \|MF_{yz}PF_xCp-k\|+\lambda_\omega\|W_p\|_1$$

are set to zero, such that only the first term remains.

In step S208, the fully sampled k-space center is deblurred, using the optimized PSF of step S206 and the undersampled Wave SPACE dataset of step S102. Therein, step S208 is an optional step in case that a Partial Fourier technique is used in acquisition.

The method ends with step S209, in which a Partial Fourier correction, for example the conventional POCS or Homodyne correction method of comparable methods as known to a person skilled in the art, are executed on the reconstructed complete wave dataset of step S207 using the deblurred fully sampled k-space center of step S208.

In the following, an embodiment of the improved method for MR image reconstruction by a combination of Wave-CAIPIRINHA and SPACE is described in greater detail, whereby advantageously high image acceleration is achieved with negligibly low noise amplification, i.e. low g-factor.

The technical implementation of Wave SPACE adds two gradient trajectories to the conventional SPACE sequence, which are preferably sinusoidal and are played out on the gradient axes of the phase and partition encoding directions during readout phase of the spin echo and stimulated echo signals 6, similar as the gradient fields of the conventional wave-CAIPI sequence shown in FIG. 1. Thereby, MR image information is distributed along the readout axis, wherein the degree of the distribution depends on the distance to the isocenter. If the k-space is additionally scanned along the two phase encoding directions for the purpose of image acceleration, convolution artifacts will occur along all three spatial directions. This is particularly the cased in the method according to the invention, as compared to conventional methods, where convolutions are limited to the two phase encoding directions only. The expansion in all three spatial directions enables Wave-CAIPIRINHA to make optimum use of the 3-dimensional coil pro-file and thus to improve the reconstruction in spite of high undersampling.

In a conventional SPACE sequence, long echo trains with a correspondingly high turbo factor are used in a repetition time (TR). Thereby, numerous k-space lines can be recorded along the phase and partition encoding directions within a single TR. In order to avoid relaxation effects, variable flip angles are used to excite magnetization, such that the magnetization is kept almost constant over the entire echo train. Since in a practical application magnetization is kept constant only in approximation, blurring effects will occur along the phase encoding directions. In combination with the Wave-CAIPIRINHA method, this can lead to strong wave-specific artifacts.

By individually adjusting and optimizing the wave parameters on both phase encoding axes, blurring induced wave artifacts can be significantly minimized. In existing wave literature, both gradient axes have with the same number of cycles and amplitude. According to the invention, gradient trajectories with a high number of cycles and low amplitude are therefore used along the gradient axis, in which strong blurring effects occur. However, since the g-factor is mainly determined by the amplitude of the wave gradients, it is recommended to use high amplitude and moderate to small number of cycles on the remaining phase encoding axes with lower blurring, wherein the slew-rate limits of the gradient apparatus are observed.

Partial Fourier is used in many common SPACE protocols in or-der to achieve a desired effective TE. For this purpose, the k-space center is usually fully sampled, e.g. 24×24 lines, and a phase correction is carried out using a Partial Fourier Reconstruction, a Margosian filter, POCS or equivalent techniques.

In the Wave SPACE sequence, the k-space center can still be fully sampled, but the use of a Partial Fourier Reconstruction is not possible ad hoc due to the wave gradients. As a necessary preparation step, the fully sampled k-space center image is folded with the Point Spread Function (PSF) of the wave gradients. This results in a low-resolution image, comparable to the conventional SPACE sequence, which then can be used for the phase correction with the methods described above.

If the Point Spread Function is not explicitly measured, but determined using a data-driven gradient calibration, as described in the document "Autocalibrated wave-CAIPI reconstruction; Joint optimization of k-space trajectory and parallel imaging reconstruction" by Cauley et al. in Magn Reson Med, 2016 Oct. 21, doi: 10.1002/mrm. 26499, the unsampled area, also referred to as the Partial Fourier area, can be filled with zeros and the wave gradient calibration can be performed on this data. The result of the procedure is the PSF and a low-resolution image of the k-space center.

The Wave-CAIPI sequence has been published and studied in combination with the GRE sequence, as described in the document "Wave-CAIPI for highly accelerated 3D imaging" by Bilgic et al. in Magn Reson Med. 2015 June; 73(6):2152-62, the MPRAGE sequence, as described in the document "Wave-CAIPI for highly accelerated MP-RAGE imaging" by Polak et al. in Magn Reson Med. 2017 Feb. 20 doi:10.1002/mrm.26649, and 2D-TSE, as de-scribed in the document "RARE/turbo spin echo imaging with Simultaneous Multislice Wave-CAIPI" by Gagoski et al. in Magn Reson Med. 2015 March, 73(3):929-938.

A combination of Partial Fourier and Wave-CAIPI is possible by using the intermediate step as described above, wherein the combination of Partial Fourier and Wave-CAIPIRINHA is also important for the acceleration of other MR imaging sequences.

Wave SPACE enables a strong reduction of measurement time with negligibly small g-factor, which makes SPACE acquisitions (in particular FLAIR contrast) more relevant for clinical routine, for example a R=3×3 FLAIR Dark Fluid has been accomplished in 1:53 min.

Acceleration can also be used, partially or wholly, to reduce blurring effects by reducing the turbo factor, which is particularly interesting in imaging of cartilage, other MSK applications, neurography, and vessel wall imaging, at the expense of measuring time reduction.

3D-SPACE is particularly advantageous for acceleration with Wave-CAIPIRINHA due to its variable excitation flip angle and corresponding reordering, since in contrast to 2D-TSE large jumps in the K-space are avoided. In addition, blurring-induced wave-induced artifacts can be efficiently suppressed by appropriate selection of the wave parameters.

From the above, some general conclusions can be made:

The gradient magnetic fields can be undulating gradient magnetic fields, e.g. with a sinuous or other wavelike signal shape, in at least one spatial direction. The gradient magnetic fields can also be undulating gradient fields in two, or in three different spatial directions. The use of undulating gradient magnetic fields in at least one spatial direction enables efficient use of the 3D coil sensitivities for the reconstruction process, whereby a better MR image quality, respectively shorter MR image acquisition times, can be provided.

With respect to the undulating gradient magnetic fields, the method can further comprise adjusting first undulation parameters, which define undulation of a first gradient magnetic field in a first spatial direction. Adjusting the first undulation parameters can comprise minimizing the amplitude of the undulation in the first spatial direction and/or minimizing the period of the undulation in the first spatial direction. In some embodiments, the amplitude of the undulation of the first gradient magnetic field in the first spatial direction can be 30% smaller than in another direction, and the period of the undulation in the first gradient magnetic field can be 30% smaller than in another direction. In another embodiment, the amplitude and the period in the first direction may be 3 or 4 times smaller than in another spatial direction, which enables a particular good SNR and low g-factor. Reducing the amplitude and the period of the undulation in a first direction, provides a better MR image quality by reducing blurring artefacts in the first spatial direction, wherein further the particular direction can be chosen as first spatial direction, in which blurring artefacts are most prevalent of all spatial directions.

The method can further include adjusting second undulation parameters, which define undulation of a second gradient magnetic field in a second spatial direction different from the first spatial direction. Adjusting the second undulation parameters can comprise maximizing the amplitude of the undulation in the second spatial direction and/or maximizing the period of the undulation in the second spatial direction. In some embodiments, the amplitude of the undulation in the second gradient magnetic field can be 30% larger than in another spatial direction, and the period of the undulation in the second gradient magnetic field can be 30% larger than in an-other direction. In another embodiment, the amplitude and the period in the first direction may be 3 or 4 times larger than in another spatial direction, which enables a particularly enhanced SNR and low g-factor. Increasing the amplitude and the period in a second direction different from the first direction, provides a better MR image quality by enabling a low g-factor and a good signal to noise ratio (SNR).

The undersampled MR measurement data can be at least partially not sampled on a first side of the k-space center, wherein the method can further include applying a k-space filter to the undersampled MR measurement data. For small Partial Fourier factors, application of a k-space filter after the Wave reconstruction is sufficient and does not require the acquisition of a fully sampled k-space center in combination with Partial Fourier correction, enabling a faster processing time in the MR image reconstruction process.

The undersampled MR measurement data can be at least partially not sampled on a first side of the k-space center, wherein the undersampled MR measurement data can be fully sampled in a central region of k-space, wherein the method can further comprise executing a phase correction of the undersampled MR measurement with a Partial Fourier technique using fully sampled MR measurement data from the central region of k-space. By executing a phase correction by a Partial Fourier technique, MR image quality is improved for higher Partial Fourier factors, where a k-space filter is not sufficient.

Executing a phase correction can include applying a Point-Spread-Function of the gradient fields to the central region of k-space to generate a lower resolution MR image, and executing the phase correction with a Partial Fourier technique using the lower resolution MR image. Therein, applying the Point-Spread-Function (PSF) to fully sampled MR measurement data from the central region of k-space can comprise reconstructing an MR image from the fully sampled MR measurement data from the central region of k-space, and convolving said MR image with the Point-Spread-Function of the gradient fields to generate a lower resolution MR image. By applying a Point-Spread-Function of the gradient fields to the central region of k-space, the execution of a Partial Fourier technique on the undersampled MR measurement data is enabled, which is conventionally not possible due to curved k-space trajectories.

The Point-Spread-Function can be determined by a data-driven gradient calibration comprising filling the undetermined parts of the undersampled MR measurement data substantially with zeros, and performing a data-driven gradient calibration based on the filled undersampled MR measurement data to determine the Point-Spread-Function.

The following further characteristics of the MR measurement method according to the first embodiment of the invention are advantageous for improved MR image quality and reduced MR measurement time. For example, the MR measurement method can be a 3D Turbo Spin Echo (TSE) technique. The RF pulses can be non-selective refocusing pulses. The RF pulses can include excitation, refocusing, and store/recall pulses. The RF pulses can induce variable flip angles. By the above specific con-figurations of the RF pulses, the length of the echo trains can be increased encompassing more phase encoding steps, which leads to shorter MR measurement or acquisition times. The sequence of k-space measurement points for detecting the undersampled MR measurement data can be ordered corresponding to variable flip angles induced by the RF pulses. In a further embodiment, the method can be adjusted for an isotropic measurement resolution.

The MR measurement data according to the second embodiment of the invention can be provided using a wave-CAIPI MR measurement method.

Summarizing, MR imaging methods for generating an MR image of an examination object in a MR apparatus comprising at least two receiving coils are provided, wherein gradient magnetic fields are applied to the examination region concurrent with stimulated echo signals, such that trajectories, which are not constant lines, are generated in k-space. According to a first embodiment of the invention, a sequence of RF pulses is applied to generate stimulated echo signals in the examination object, undersampled MR measurement data are detected during receiving of said stimulated echo signals in the at least two receiving coils using the curved k-space trajectories, and fully sampled MR measurement data are generated from the undersampled MR measurement data using sensitivity information of the at least two receiving coils. According to a second embodiment of the invention, MR measurement data is fully sampled in a central region of k-space, wherein the region outside the central region is not fully sampled, and a phase correction with a Partial Fourier technique is executed on the MR measurement data using fully sampled MR measurement data from the central region of k-space.

The methods according to the invention advantageously provide shorter MR measurement without resolution losses and with negligible noise amplification using a lower number of coils, which results in better MR image quality and shorter MR measurement times compared to conventional MR imaging methods, whereby in particular patient throughput can be increased and the risk of motion artifacts can be reduced.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating a magnetic resonance (MR) image of an examination object comprising:
    operating an MR data acquisition scanner, comprising a radio-frequency (RF) antenna arrangement that includes at least two receiving coils, in order to apply a sequence of RF pulses that generate stimulated echo signals in an examination object situated in the MR data acquisition scanner;
    operating said MR data acquisition scanner to apply gradient magnetic fields concurrently with the stimulated echo signals, which produce trajectories in k-space for entering MR data into k-space along lines that are not straight;
    operating the MR data acquisition scanner to detect undersampled MR measurement data during the stimulated echo signals using said at least two receiving coils;
    in a computer, generating fully sampled MR measurement data from the undersampled MR measurement data using sensitivity information of the at least two receiving coils; and
    in said computer, reconstructing an MR image from the fully sampled MR measurement data, and making the MR image available from the computer in electronic form as a data file.

2. A method as claimed in claim 1 comprising operating said MR data acquisition scanner to apply said gradient magnetic fields as undulating gradient magnetic fields in at least one spatial direction.

3. A method as claimed in claim 2 comprising operating said MR data acquisition scanner to adjust undulation parameters that define the undulation of said undulating gradient magnetic field in said spatial direction, in order to minimize at least one of an amplitude of the undulation in said spatial direction and a period of the undulation in said spatial direction.

4. A method as claimed in claim 3 wherein said undulating gradient magnetic field is a first undulating gradient magnetic field in a first spatial direction and wherein said undulation parameters are first undulation parameters, and wherein said method comprises operating said MR data acquisition scanner to apply a second undulating gradient magnetic field in a second spatial direction that differs from the first spatial direction, and adjusting second undulation parameters that define undulation of said second gradient magnetic field in said second spatial direction, in order to perform at least one of maximization of an amplitude of the undulation in the second spatial direction and minimization of the period of the undulation in said second spatial direction.

5. A method as claimed in claim 1 wherein at least a portion of the undersampled MR measurement data is not sampled on a first side of a center of k-space, and wherein said method comprises applying a k-space filter to the undersampled MR measurement data.

6. A method as claimed in claim 1 wherein at least a portion of the undersampled MR measurement data is not sampled on a first side of a center of k-space, and wherein the undersampled MR data are fully sampled in a central region of k-space, and wherein said method comprises, in said computer, implementing a phase correction on the undersampled MR measurement data with a partial Fourier technique, using the fully sampled MR measurement data from the central region of k-space.

7. A method as claimed in claim 6 comprising implementing said phase correction by:
applying a point spread function of said magnetic gradient field to the central region of k-space in order to generate a lower resolution MR image; and
implementing the phase correction with a partial Fourier technique using the lower resolution MR image.

8. A method as claimed in claim 7 comprising applying said point spread function to the fully sampled MR measurement data from the central region of k-space by:
reconstructing an MR image from the fully sampled MR measurement data from the central region of k-space; and
convolving said MR image with said point spread function of the magnetic gradient field in order to generate said lower resolution MR image.

9. A method as claimed in claim 7 comprising determining said point spread function by executing a data-driven gradient calibration in said computer, comprising:
filling available data entry points in k-space, which are left empty by the undersampled MR measurement data, with zeros; and
performing a data-driven calibration using the zero-filled undersampled MR measurement data in order to determine said point spread function.

10. A method as claimed in claim 1 comprising operating said MR data acquisition scanner to apply said sequence of RF pulses and said gradient magnetic fields in a 3D turbo spin echo sequence.

11. A method as claimed in claim 1 comprising applying said RF pulses so as to include RF excitation pulses, RF refocusing pulses, and RF store/recall pulses.

12. A method as claimed in claim 1 comprising operating said MR data acquisition scanner to apply said RF pulses so as to induce variable flip angles of nuclear spins in the examination object.

13. A method as claimed in claim 12 comprising organizing a sequence of k-space data entry points for filling by said undersampled MR measurement data in said trajectory in k-space, according to the variable flip angles induced by the RF pulses.

14. A method as claimed in claim 1 comprising adjusting the method for an isotropic measurement resolution.

15. A magnetic resonance (MR) apparatus comprising:
an MR data acquisition scanner comprising a radio-frequency (RF) antenna arrangement that includes at least two receiving coils, and a gradient coil arrangement;
a computer configured to operate said MR data acquisition scanner in order to apply a sequence of RF pulses that generate stimulated echo signals in an examination object situated in the MR data acquisition scanner;
said computer being configured to operate said MR data acquisition scanner to apply gradient magnetic fields concurrently with the stimulated echo signals, which produce trajectories in k-space for entering MR data into k-space along lines that are not straight;
said computer being configured to operate the MR data acquisition scanner to detect undersampled MR measurement data during the stimulated echo signals using said at least two receiving coils;
said computer being configured to generate fully sampled MR measurement data from the undersampled MR measurement data using sensitivity information of the at least two receiving coils; and
said computer being configured to reconstruct an MR image from the fully sampled MR measurement data, and to make the MR image available from the computer in electronic form as a data file.

16. A non-transitory, computer-readable data storage medium encoded with programming instructions, said storage medium being loaded into a control computer of a magnetic resonance (MR) apparatus that comprises an MR data acquisition scanner having a radio-frequency (RF) antenna arrangement that includes at least two receiving coils, said programming instructions causing said control computer to:
operate said MR data acquisition scanner in order to apply a sequence of RF pulses that generate stimulated echo signals in an examination object situated in the MR data acquisition scanner;
operate said MR data acquisition scanner to apply gradient magnetic fields concurrently with the stimulated echo signals, which produce trajectories in k-space for entering MR data into k-space along lines that are not straight;
operate the MR data acquisition scanner to detect undersampled MR measurement data during the stimulated echo signals using said at least two receiving coils;
generate fully sampled MR measurement data from the undersampled MR measurement data using sensitivity information of the at least two receiving coils; and
reconstruct an MR image from the fully sampled MR measurement data, and make the MR image available from the computer in electronic form as a data file.

* * * * *